US009046617B2

(12) United States Patent (10) Patent No.: US 9,046,617 B2
Gonda (45) Date of Patent: Jun. 2, 2015

(54) RADIATION IMAGING APPARATUS

(75) Inventor: Takaaki Gonda, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 342 days.

(21) Appl. No.: 13/280,637

(22) Filed: Oct. 25, 2011

(65) Prior Publication Data

US 2012/0104271 A1 May 3, 2012

(30) Foreign Application Priority Data

Oct. 29, 2010 (JP) .................................. 2010-243801

(51) Int. Cl.
*H01L 27/146* (2006.01)
*G01T 1/24* (2006.01)

(52) U.S. Cl.
CPC .............. *G01T 1/244* (2013.01); *H01L 27/146* (2013.01)

(58) Field of Classification Search
CPC ..... G01T 1/244; H01L 23/34; H01L 23/3672; H01L 23/42; H01L 31/024; H01L 33/64; H01L 33/642
USPC .............. 250/370.15, 370.08, 370.09, 361 R; 257/712, 713, 718, 720, 731
See application file for complete search history.

(56) References Cited

U.S. PATENT DOCUMENTS

| | | | |
|---|---|---|---|
| 7,550,733 B2* | 6/2009 | Endo et al. ................ | 250/370.09 |
| 2006/0076500 A1* | 4/2006 | Watanabe ................. | 250/370.15 |
| 2008/0067672 A1* | 3/2008 | Katoh et al. ................. | 257/712 |
| 2009/0084971 A1 | 4/2009 | Ohta et al. | |
| 2011/0211673 A1 | 9/2011 | Kawasaki et al. | |
| 2012/0138798 A1* | 6/2012 | Kato et al. ................. | 250/336.1 |

FOREIGN PATENT DOCUMENTS

| | | |
|---|---|---|
| JP | 2002-344809 A | 11/2002 |
| JP | 2003-194951 A | 7/2003 |
| JP | 2007-199079 A | 8/2007 |
| JP | 2007-289281 A | 11/2007 |
| JP | 2009-082297 A | 4/2009 |
| JP | 2009-085630 A | 4/2009 |
| JP | 2010-145349 A | 7/2010 |
| JP | 2010-237543 A | 10/2010 |
| WO | 2010-038877 A1 | 4/2010 |

OTHER PUBLICATIONS

Engineering Toolbox, "Thermal Conductivity of Some Commone Materials and Gases," Retrieved from url <http://www.engineeringtoolbox.com/thermal-conductivity-d_429.html>. Retrieved from Internet [Oct. 27, 2013].*
Notification of Reasons for Refusal;Reference No. 0092281-01; for counterpart foreign Patent Application No. JP 2010-243801; Dispatch Date: Jun. 3, 2014. (Original and full translation documents are enclosed).

* cited by examiner

*Primary Examiner* — Yara B Green
(74) *Attorney, Agent, or Firm* — Canon USA Inc. IP Division

(57) ABSTRACT

A radiation imaging apparatus includes a radiation flat panel detector configured to detect radiation incident thereupon and to generate a radiation image, a control unit configured to control a drive of the radiation flat panel detector, a heat insulation member arranged between the radiation flat panel detector and the control unit, an external housing configured to accommodate therein the flat panel detector and the control unit, a first heat transfer member configured to transfer heat from the radiation flat panel detector to a first surface of the external housing, and a second heat transfer member configured to transfer heat from the control unit to a second surface of the external housing different from the first surface.

10 Claims, 7 Drawing Sheets

RADIATION IMAGING APPARATUS

BACKGROUND OF THE INVENTION

1. Field of the Invention

The present invention relates to a radiation imaging apparatus that detects radiation which has passed through an object, and generates a radiation image.

2. Description of the Related Art

In recent years, a flat panel type of radiation imaging apparatus of an same size optical system using photoelectric conversion element has been in widespread use, for the purposes of enhancement of resolutions, reduction in size of housings, and suppression of distortions of images, in the field of a digital radiation imaging apparatus (X-ray imaging apparatus). The imaging apparatuses using the photoelectric conversion elements include amorphous silicon type, charge-coupled device (CCD) type, complementary metal oxide semiconductor (CMOS) type, and the like.

(1) Amorphous Silicon Type

An advantage of the amorphous silicon type of imaging apparatuses includes the ability to easily create an image sensor of a large-screen which uses amorphous silicon semiconductor on a glass substrate. However, since semiconductor characteristics are not adequate, it is difficult to perform high-speed operations. Further, amorphous silicon has more difficulty in microfabrication of semiconductor substrate on the glass substrate, in comparison to single-crystal silicon semiconductor substrate, and as a result, capacitance of output signal lines becomes larger, and kTC noise (thermal noise on capacitors) becomes more likely to be generated.

(2) CCD Type

Advantages of the CCD type of imaging apparatus include the ability of becoming fully-depleted and a high-sensitivity to radiation. However, it is unfit to trend toward a larger screen size. Since the CCD is of an electric charge transfer type, the CCD has a large area and the number of transfer stages of electric charge transfer is increased. In this case, driving voltages differ between different locations at drive end and near the center, and thus a complete transfer becomes difficult. Further, a power consumption is represented by $CVf2$ (C denotes a capacitance between substrate and well, V denotes a pulse amplitude, f denotes a pulse frequency). C and V tend to become large in large detector areas, thus power consumption becomes up to ten times greater in a CCD image sensor as compared to a CMOS image sensor.

(3) CMOS Type

Advantages of the CMOS type of imaging apparatus include the fact that a higher speed readout than the amorphous silicon type is made possible by microfabrication, and besides a high sensitivity can be obtained. Further, there are no problems with the number of transfer stages of electric charge transfer and power consumption as encountered in the CCD image sensor. Accordingly, it is easy to produce a large area imaging apparatus. In particular, it is well known that a CMOS type imaging apparatus offers superior performance as a moving image capturing device of large-area flat panel sensor.

Japanese Patent Application Open-Laid No. 2002-344809 discusses a technology to realize a large-area detector by using a CMOS image sensor for the photoelectric conversion element. In this case, a large-area flat panel type of radiation flat panel detector is obtained by subjecting a rectangular semiconductor substrate to a tiling process. The rectangular semiconductor substrate is obtained by cutting out CMOS photoelectric conversion element in a rectangular shape from silicon semiconductor wafer.

However, the flat panel type of radiation detector, which has used the CMOS image sensor, has amplifiers on a per-pixel basis, and thus thermal noise due to heat generation of the amplifiers has become a problem. Since images generated by the image sensor are negatively influenced by heat, image quality of the acquired X-ray images may be degraded due to the thermal noise.

In addition, due a trend towards a reduction in size and thinning of radiation imaging apparatuses, electronic components thereof must be closely packaged. For example, a distance from a control unit including electrical components for driving the radiation flat panel detector becomes nearer, thus the heat generated by the control unit may be easily transmitted to the radiation flat panel detector.

Japanese Patent Application Open-Laid No. 2009-085630, as measure to reduce thermal noise, proposes transmitting the heat generated by the radiation flat panel detector to the outside, thereby suppressing temperature rise of the radiation flat panel detector.

Japanese Patent Application Open-Laid No. 2003-194951, as measure to reduce heat of the control unit, also discloses a technique for dissipating the heat generated from the control unit to an external housing.

Despite of the state of the art described above, even if the heat of the radiation flat panel detector has been dissipated to the external housing by using the technology discussed in Japanese Patent Application Open-Laid No. 2009-085630, when the heat generated from the control unit including electronic components is conveyed to the radiation flat panel detector, it may result in adverse effects on the captured radiation images to be generated.

A technology for mitigating the heat emanating from the control unit is discussed in Japanese Patent Application Open-Laid No. 2003-194951. However, the heat generated from a power source apparatus and other electronics that control an imaging apparatus tend to add up and negatively affect imaging performance therein. Thus, the countermeasures discussed in Japanese Patent Application Open-Laid No. 2003-194951 and in the above-discussed references have not achieved an optimal solution to address the problems of heat affecting radiation flat panel detectors.

In particular, local temperature rise may occur in the electronic components, and there is a possibility that local noises be generated in the radiation imaging images previously created. The radiation images may be used in medical diagnosis, and generation of the local noises must be avoided as far as possible.

SUMMARY OF THE INVENTION

At least one embodiment of the present invention is directed to enhancing suppression of thermal influence of a control unit on a radiation flat panel detector, in a radiation imaging apparatus.

According to an aspect of the present invention, a radiation imaging apparatus includes a radiation flat panel detector configured to detect radiation incident thereupon and to generate a radiation image, a control unit configured to control a drive of the radiation flat panel detector, a heat insulation member arranged between the radiation flat panel detector and the control unit, an external housing configured to accommodate therein the flat panel detector and the control unit, a first heat transfer member configured to transfer heat from the radiation flat panel detector to a first surface of the external housing, and a second heat transfer member configured to transfer heat from the control unit to a second surface of the external housing different from the first surface.

Further features and aspects of the present invention will become apparent from the following detailed description of exemplary embodiments with reference to the attached drawings.

BRIEF DESCRIPTION OF THE DRAWINGS

The accompanying drawings, which are incorporated in and constitute a part of the specification, illustrate exemplary embodiments, features, and aspects of the invention and, together with the description, serve to explain the principles of the invention.

DESCRIPTION OF THE EMBODIMENTS

Various exemplary embodiments, features, and aspects of the invention will be described in detail below with reference to the drawings.

Descriptions of respective exemplary embodiments as below are given assuming a radiation imaging apparatus using the CMOS image sensor in which the need for minimizing thermal influence is high.

However, the present invention is not limited to the radiation imaging apparatus using the CMOS image sensor, but can be also applied to a radiation imaging apparatuses using other image sensors such as amorphous silicon type, or CCD type.

Figure 1:
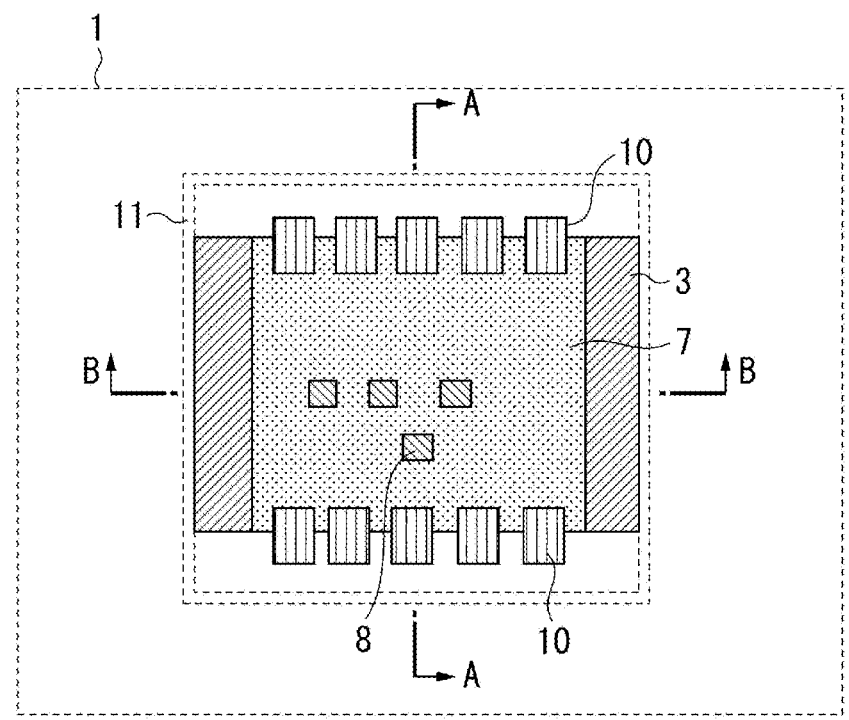
FIG. 1 is a plan view illustrating an opposite surface of X-ray incident surface of a radiation imaging apparatus.
Figure 6:
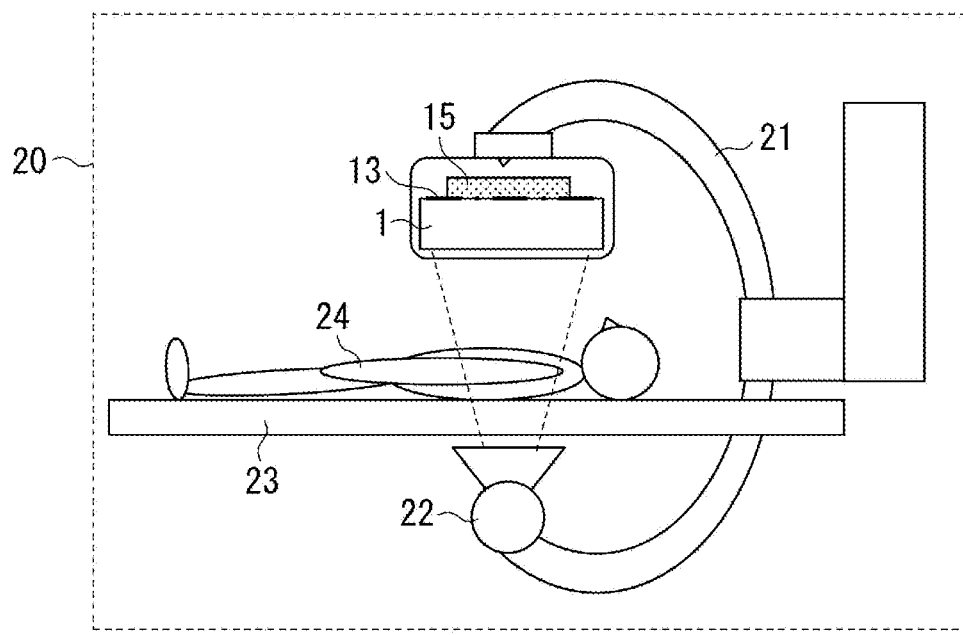
FIG. 6 illustrates a schematic view when the radiation imaging apparatus is mounted on a C-type arm device.

A first exemplary embodiment will be described. FIG. 1 is a plan view illustrating a radiation imaging apparatus 1 having a surface opposite to X-ray incident side of the radiation imaging apparatus in the present exemplary embodiment. In other words, as illustrated in FIG. 1, X-ray radiation is incident upon the radiation imaging apparatus 1 from the rear side to front side. In FIG. 1, an external housing 11 is indicated by dotted lines to illustrate an internal structure of a radiation imaging apparatus 1. The radiation imaging apparatus 1 is connected to a radiation generation apparatus, an imaging control device, and other electronics as illustrated in FIG. 6. The radiation imaging apparatus 1 connected in this manner functions as a radiation imaging system for acquiring radiation images of objects of interest.

Figure 2:
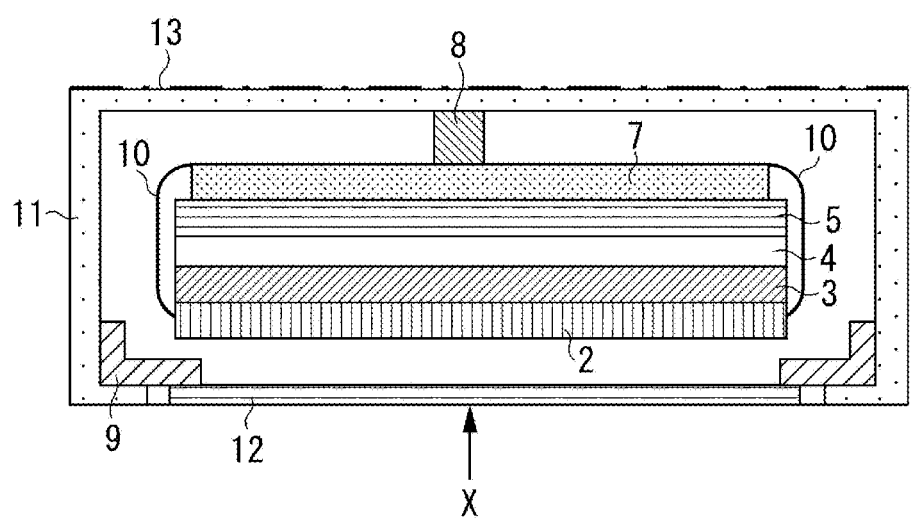
FIG. 2 illustrates a cross-sectional view taken on line A-A in FIG. 1.

FIG. 2 illustrates a cross-sectional view taken along sectional marks A-A in FIG. 1. To detect radiation and generate radiation images, X-ray radiation is incident from underside (arrow X) of the radiation imaging apparatus 1 illustrated in FIG. 2. Hereinbelow, members arranged in the radiation imaging apparatus 1 will be described with reference to FIG. 1 and FIG. 2.

A radiation flat panel detector 2 is arranged in the radiation imaging apparatus 1, and is a rectangular flat plate-like sensor that detects intensity distribution of X-rays which have passed through an object 24 (FIG. 6 described below).

On the X-ray incident surface and surface of the opposite side of the radiation flat panel detector 2, there is arranged a detector holding member 3 (first holding unit) that holds the radiation flat panel detector 2 inside the external housing 11. The detector holding member 3 also functions as a first heat transfer member for transmitting the heat generated in the radiation flat panel detector 2 to the external housing 11.

A heat insulation member 4 shields transfer of the heat between the radiation flat panel detector 2 and an electrical component 7.

An electrical component holding member 5 functions as a second holding member that holds the electrical component 7 within the external housing 11. The electronic component 7 functions as a control unit that performs drive control of the radiation flat panel detector 2 and signal processing. The electronic component 7 includes without limitation a circuit substrate, a power source, and other electronics necessary for drive control of the radiation flat panel detector 2 and signal processing.

A heat transfer member 8 functions as a second heat transfer member that transmits heat generated in the electronic component 7 to the external housing 11. The heat transfer member 8 is connected to an opposite surface (second surface) to the X-ray incident surface of the external housing 11.

A frame 9 is a frame for strengthening an internal structure of the radiation imaging apparatus 1. The frame 9 is composed of material such as iron or stainless steel having a high rigidity.

A connection wiring 10 electrically connects one side of the radiation flat panel detector 2 to the electrical component 7. The connection wiring 10 transmits a control signal from the electrical component 7 to the radiation flat panel detector 2, and transmits data of the radiation images acquired in the radiation flat panel detector 2 to the electrical component 7.

The external housing 11 is a housing for protecting the above-described members. The external housing 11 is structured and specifically designed to accommodated the radiation flat panel detector 2, the detector holding member 3, the heat insulation member 4, the electrical component holding member 5, the electronic component 7, the heat transfer member 8, the frame 9, the connection wiring 10, and the like.

When the connection wiring 10 is arranged on a side surface of the detector holding member 3, a position of the side surface of the detector holding member 3 is designed to be located further out than a side surface of the radiation flat panel detector 2, and inner than the connection wiring 10. This is to evenly convey the heat to the external housing 11 by bringing the detector holding member 3 into close contact with the entire surface of the radiation detector 2, and to prevent the heat of the detector holding member 3 from being transferred to the connection wiring 10.

A radiation incident cover 12 is connected to the external housing 11, and is a cover for covering the radiation flat panel detector 2. The radiation incident cover 12 is composed of material such as carbon fiber reinforced plastic (CFRP) or aluminum of which X-ray transmittance is greater than a predetermined value, to make X-ray radiation easily reach the radiation flat panel detector 2.

A heat radiating surface 13 is arranged on the surface of the external housing 11, and dissipates heat, which has been transmitted from the heat transfer member 8 to the external housing 11, to outside air.

Figure 3:
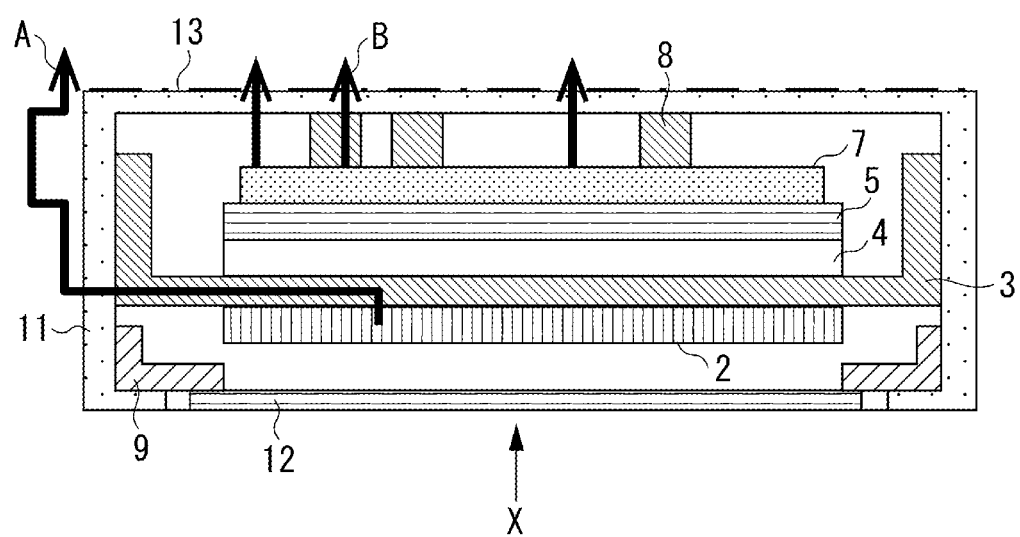
FIG. 3 illustrates a cross-sectional view taken on line B-B in FIG. 1.

FIG. 3 illustrates a cross-sectional view taken along sectional marks B-B in FIG. 1. The X-ray radiation is incident from underside (arrow X) of the radiation imaging apparatus illustrated in FIG. 3. As illustrated in FIG. 3, on the side surface where the connection wiring 10 (FIG. 2) is not arranged, the detector holding member 3 extends to the external housing 11, and is connected to the side surface (first surface) of the external housing 11.

The detector holding member 3 and the external housing 11 are formed of materials which have higher coefficient of thermal conductivity than that of the electrical component holding member 5. The heat evenly generated from the surface of the radiation flat panel detector 2 is transmitted to the detector holding member 3, and is further dissipated to the outside through the external housing 11 and the heat radiating surface 13.

Further, heat of eccentrically-located heating elements which are arranged within the electrical component 7 is transmitted to the heat transfer member 8 made of material having greater coefficient of thermal conductivity than that of the electrical component holding member 5, and further is conveyed up to the heat radiating surface 13 and dissipated to the outside.

By this structure, the heat of the radiation flat panel detector 2 and the heat of the heating elements arranged within the electrical component 7 are each dissipated to the outside through separate heat transmission paths "A" and "B" (FIG. 3). Hence, the heat of the eccentrically-located heating elements within the electrical component 7 can be prevented from being conveyed to the radiation flat panel detector 2. In short, thermal influence of the control unit on the radiation flat panel detector 2 such as local temperature rise can be suppressed.

As materials which realize a relationship of thermal conductivities as described above, there are combinations of, for example, aluminum or copper having high thermal conductivity for the detector holding member 3 and the external housing 11, iron or stainless steel for the electrical component holding member 5, and aluminum, copper or radiating rubber having high thermal conductivity for the heat transfer member 8.

Further, the electrical component 7 can be protected from the X-rays by composing the electrical component holding member 5 of material such as iron or stainless steel or the like having a high rigidity, and having a smaller radiation transmittance (X-ray transmittance) than the predetermined value.

A structure between the radiation flat panel detector 2 and the electrical component 7 is composed of three layers of the detector holding member 3, the heat insulation member 4 and the electrical component holding member 5.

A high rigidity of the three-layer structure can be realized by increasing a thickness of the entire structure, and adding the electrical component holding member 5 composed of material such as iron or stainless steel having a high rigidity to the configuration.

Figure 4:
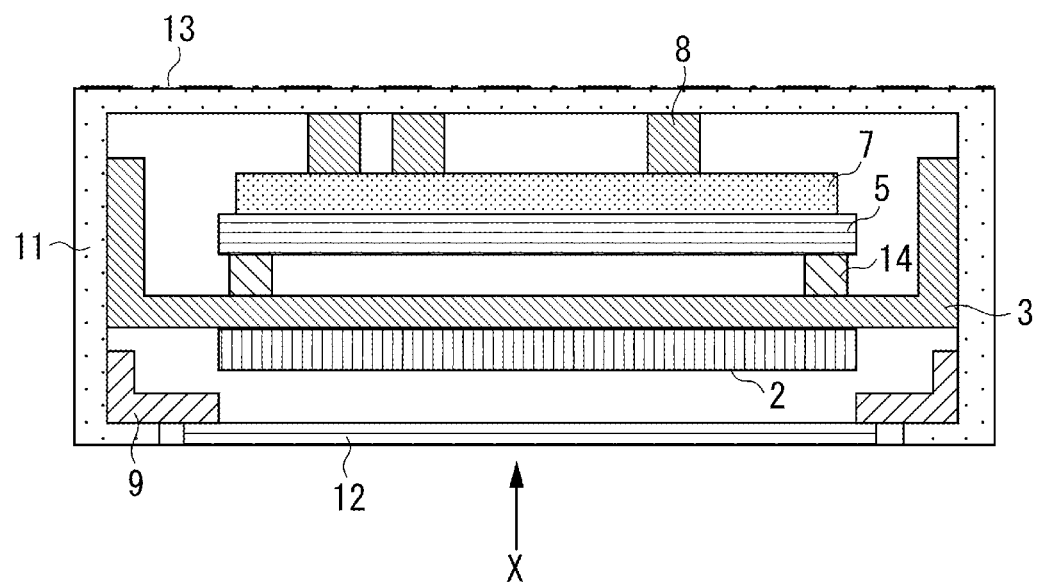
FIG. 4 illustrates a cross-sectional view taken on line B-B in FIG. 1 when a heat insulation member is constituted by an air layer.

Furthermore, by replacing the heat insulation member 4 with an air layer as illustrated in FIG. 4, and arranging an air layer constituent component 14 composed of material such as resin with a small thermal conductivity to constitute a holding structure, it is possible to make the holding structure lighter in weight.

A second exemplary embodiment will be described. The point in which the second exemplary embodiment is different from the first exemplary embodiment is that a cooling device is arranged on the radiation imaging apparatus 1.

Figure 5:
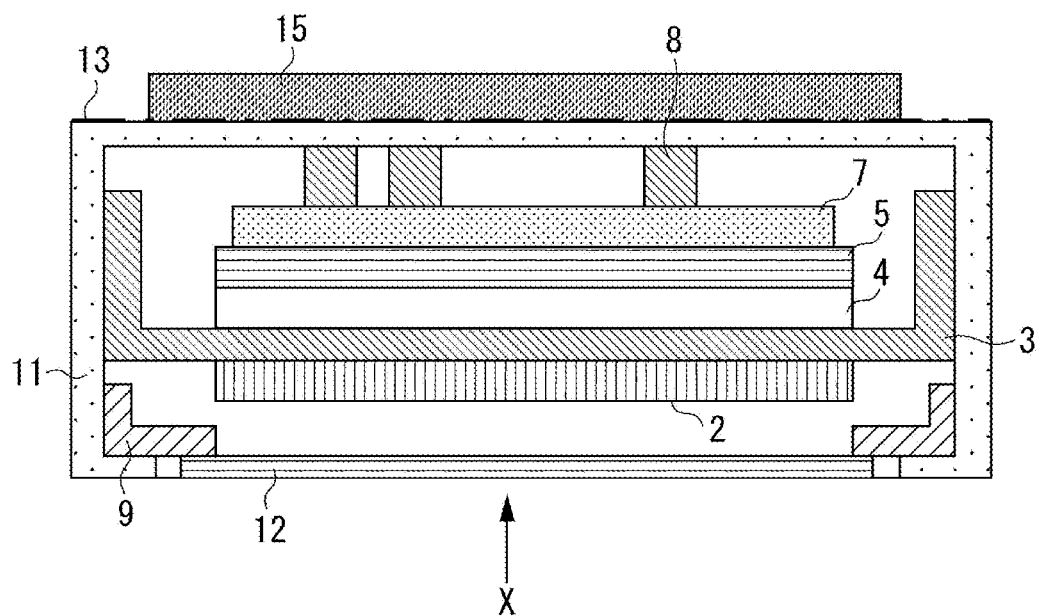
FIG. 5 illustrates a cross-sectional view taken on line B-B in FIG. 1 when a cooling device is arranged in the radiation imaging apparatus.

FIG. 5 illustrates a cross-sectional view taken along sectional marks B-B in FIG. 1, when a cooling device 15 is arranged on the radiation imaging apparatus 1. In addition to the configuration of the first exemplary embodiment, the cooling device 15 such as a cooling fan, or a water cooling apparatus, or a Peltier device is arranged on the heat radiating surface 13 of the external housing 11. There is a relative difference in the thermal conductivities among the detector holding member 3, the heat insulation member 4, the electrical component holding member 5 and the heat transfer member 8, so that a heat transmission pathway from the radiation flat panel detector 2 to the heat radiating surface 13 and a heat transmission pathway from the heating elements within the electrical component 7 to the heat radiating surface 13 each are different pathways.

Hence, the radiation flat panel detector 2 and the heating elements within the electrical component efficiently can be cooled without any influence of respective heats. By arranging the cooling device 15 on the heat radiating surface 13, and effecting forced air cooling, the temperature rise of the radiation flat panel detector 2 can be suppressed more efficiently than heat dissipation with natural convection, and temperature distribution can be made uniform.

A third exemplary embodiment will be described. The point in which the present exemplary embodiment is different from the first exemplary embodiment is that it includes a C-type arm device 20 that can move the radiation imaging apparatus 1.

FIG. 6 illustrates a schematic view when the radiation imaging apparatus 1 is mounted on the C-type arm device 20. On the one end of the C-type arm 21 are arranged the radiation imaging apparatus 1 and the cooling device 15 arranged on the surface of the heat radiating surface 13, and on the other end is arranged an X-ray tube 22.

By providing a heat transmission path between the heat radiating surface 13 of the radiation imaging apparatus 1 and the C-type arm 21, the temperature rise of the radiation flat panel detector 2 can be suppressed more efficiently than the heat dissipation with natural convection, and the temperature distribution can be made uniform.

Between the radiation imaging apparatus 1 and the X-ray tube 22 of the C-type arm 21 is arranged an object 24 and a bed 23 for laying the object 24 thereon, and treatment under X-ray radioscopy is performed. When the treatment under X-ray radioscopy is performed, a doctor or radiation engineer operates the C-type arm 21 to perform image capturing. The C-type arm device 20 having a collision prevention function allows a sensor within the apparatus to detect an obstruction, when the C-type arm 21 approaches the obstruction such as the object 24 or the bed 23 within a certain distance, and causes the C-type arm 21 to come to a sudden stop to prevent it from colliding with the obstruction. In this case, since strong shock is exerted on the radiation imaging apparatus 1 arranged at the ends of the C-type arm 21, the radiation imaging apparatus 1 is required to have a high rigidity.

Figure 7:
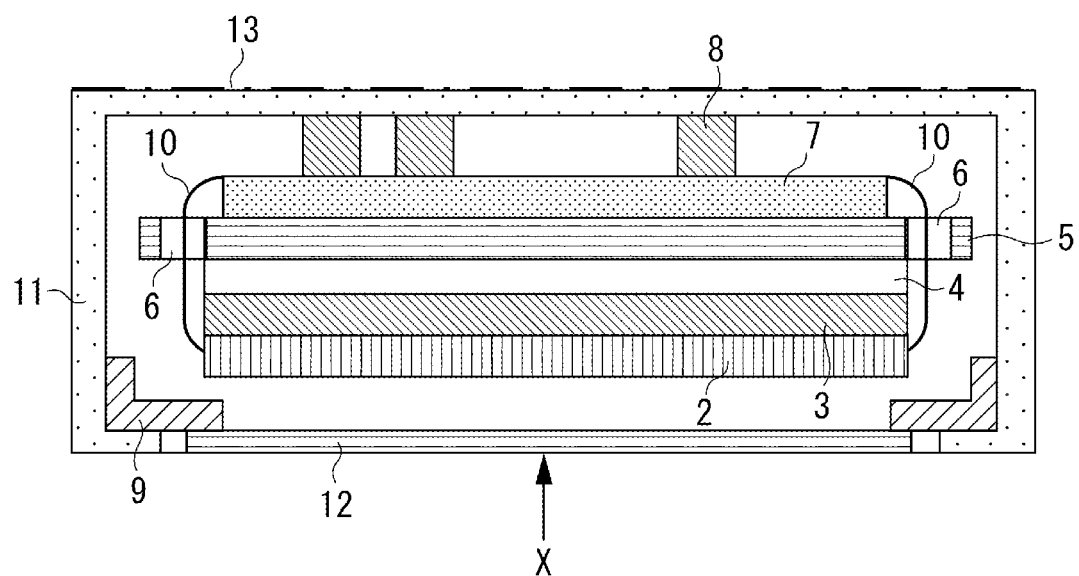
FIG. 7 illustrates a cross-sectional view taken on line A-A in FIG. 1 when a connection wiring is fixed to an electrical component holding member.

A fourth exemplary embodiment will be described. FIG. 7 illustrates a cross-sectional view taken along sectional marks A-A in FIG. 1 when a portion of the connection wiring 10 is fixed to the electrical component holding member 5. The connection wiring 10 is fixed to the electrical component holding member 5 made of material such as iron or stainless steel having a high rigidity, via a connection wiring protective member 6. If the connection wiring 10 is fixed to the electrical component holding member 5, no fluttering occurs in the interior when a shock is exerted on the radiation imaging apparatus 1. As a result, influence of noise on the radiation flat panel detector 2 can be reduced. Hence, it is possible to constitute the radiation imaging apparatus 1 that has rigidity against shocks and can acquire images which are not influenced by shocks.

Hereinabove, the exemplary embodiments for implementing the present invention have been described, but various modifications and alterations are possible within the scope of the spirit thereof.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures, and functions.

This application claims priority from Japanese Patent Application No. 2010-243801 filed Oct. 29, 2010, which is hereby incorporated by reference herein in its entirety.

What is claimed is:

1. A radiation imaging apparatus comprising:
a radiation flat panel detector having a radiation incident surface configured to detect radiation incident thereupon and to generate a radiation image;
a control unit configured to control the radiation flat panel detector;
a heat insulation member arranged between the radiation flat panel detector and the control unit;
an external housing configured to accommodate the flat panel detector, the heat insulating member, and the control unit;
a first heat transfer member configured to transfer heat from the radiation flat panel detector to a first surface of the external housing; and
a second heat transfer member configured to transfer heat from the control unit to a second surface of the external housing different from the first surface,
wherein the heat insulation member is arranged between the first heat transfer member and the second heat transfer member, and
wherein the first heat transfer member includes a side surface and a front surface, the side surface is positioned inside the external housing at an outer side of the radiation flat panel detector, the front surface is arranged opposite to the radiation incident surface of the radiation flat panel detector, and an area of the front surface is larger than an area of the radiation incident surface of the radiation flat panel detector such that the first heat transfer member holds the radiation flat panel detector within the external housing.

2. The radiation imaging apparatus according to claim 1, further comprising a holding unit which is arranged on a radiation incident side of the control unit,
wherein the holding unit holds the control unit within the external housing, and has a radiation transmittance smaller than a predetermined value, and
wherein the first heat transfer member is configured to hold the radiation flat panel detector on the front surface thereof.

3. The radiation imaging apparatus according to claim 2, wherein the first heat transfer member has a coefficient of thermal conductivity higher than that of the holding unit.

4. The radiation imaging apparatus according to claim 2, wherein the first heat transfer member and the external housing are composed of aluminum or copper, and the holding unit is composed of iron or stainless steel.

5. The radiation imaging apparatus according to claim 2, further comprising:
a connection wiring for electrically connecting at least one side of the radiation flat panel detector and the control unit,
wherein the first heat transfer member is connected to the external housing at a side different from a side to which the connection wiring is connected.

6. The radiation imaging apparatus according to claim 5, wherein a portion of the connection wiring is fixed to the holding unit.

7. The radiation imaging apparatus according to claim 1, wherein the heat insulation member has an air layer for shielding transfer of heat between the radiation flat panel detector and the control unit.

8. The radiation imaging apparatus according to claim 1, further comprising:
a C-type arm device configured to move the radiation imaging apparatus,
wherein the C-type arm device is connected to the first surface or the second surface.

9. The radiation imaging apparatus according to claim 1, further comprising:
a cooling unit configured to cool heat which has been transmitted to the second surface.

10. The radiation imaging apparatus according to claim 1, wherein the first heat transfer member is disposed between the radiation flat panel detector and the heat insulating member.

* * * * *